(12) United States Patent
Sohn et al.

(10) Patent No.: US 7,550,207 B2
(45) Date of Patent: Jun. 23, 2009

(54) BLUE-EMITTING POLYMER AND ORGANIC ELECTROLUMINESCENT DEVICE USING THE SAME

(75) Inventors: Byung-Hee Sohn, Yongin-si (KR); Woon-Jung Paek, Yongin-si (KR); In-Nam Kang, Ansan-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 472 days.

(21) Appl. No.: 11/325,566

(22) Filed: Jan. 5, 2006

(65) Prior Publication Data
US 2006/0147753 A1 Jul. 6, 2006

(30) Foreign Application Priority Data
Jan. 6, 2005 (KR) .................. 10-2005-0001142

(51) Int. Cl.
*H01L 51/54* (2006.01)
*H05B 33/14* (2006.01)
*C09K 11/06* (2006.01)
*C08G 61/12* (2006.01)

(52) U.S. Cl. .............. 428/690; 548/126; 257/40; 257/E51.028; 257/E51.036; 528/397; 528/422; 528/423; 313/504; 313/506

(58) Field of Classification Search ............ 526/280; 528/8, 327, 377, 394, 397, 422, 423, 9, 25, 528/27, 33, 37, 40, 395, 380, 398; 548/126; 257/40, 103, E51.028, E51.036, E51.037; 428/690, 917; 313/504, 506
See application file for complete search history.

(56) References Cited

U.S. PATENT DOCUMENTS

| | | | |
|---|---|---|---|
| 5,708,130 A * | 1/1998 | Woo et al. | 528/397 |
| 5,728,801 A | 3/1998 | Wu et al. | |
| 5,945,502 A * | 8/1999 | Hsieh et al. | 528/101 |
| 6,169,163 B1 | 1/2001 | Woo et al. | |
| 2004/0192871 A1 * | 9/2004 | Wang et al. | 528/4 |
| 2007/0252139 A1 * | 11/2007 | Mckiernan et al. | 257/40 |

FOREIGN PATENT DOCUMENTS

WO    WO 99/54385    10/1999

OTHER PUBLICATIONS

Olivier Stéphan et al., "Blue light electroluminescent devices based on a copolymer derived from fluorene and carbazole", Synthetic Metals 106, pp. 115-119, 1999.

D. Sainova et al., "Control of color and efficiency of light-emitting diodes based on polyfluorenes blended with hole-transporting molecules", Applied Physics Letters, vol. 76, No. 14, p. 1810, Apr. 3, 2000.

* cited by examiner

*Primary Examiner*—Callie E Shosho
*Assistant Examiner*—Michael Wilson
(74) *Attorney, Agent, or Firm*—Robert E. Bushnell, Esq.

(57) ABSTRACT

A blue-emitting polymer in which a bisindenospirofluorene unit is incorporated in a polyarylene polymer backbone, and an organic EL device using the blue-emitting polymer as a light-emitting material. One example of the blue-emitting polymer may be represented by Formula 1:

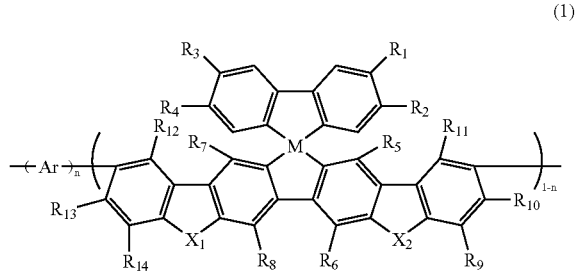

(1)

where Ar, $R_1$ through $R_{14}$, $X_1$ and $X_2$, M and n are defined in the specification. The organic EL device exhibits excellent emission efficiency, low turn-on voltage, good color stability and color purity.

19 Claims, 10 Drawing Sheets

BLUE-EMITTING POLYMER AND ORGANIC ELECTROLUMINESCENT DEVICE USING THE SAME

CROSS-REFERENCE TO RELATED PATENT APPLICATION AND CLAIM OF PRIORITY

This application claims priority from Korean Patent Application No. 10-2005-0001142, filed on Jan. 6, 2005, in the Korean Intellectual Property Office, the disclosure of which is incorporated herein in its entirety by reference.

1. Field of the Invention

The present invention relates to a blue-emitting polymer and an organic electroluminescent device using the same. More particularly, the present invention relates to a blue-emitting polymer in which a bisindenospirofluorene unit is incorporated in a polyarylene polymer backbone, and an organic electroluminescent device using the blue-emitting polymer as a light-emitting material, which is enhanced in emission efficiency and color purity characteristics.

2. Description of the Related Art

Organic electroluminescent devices (hereinafter, referred to as "organic EL devices") are self-emission displays that emit light by recombination of electrons and holes in a thin layer (hereinafter, referred to as "organic layer") made of a fluorescent or phosphorescent organic compound when a current is applied to the organic layer. The organic electroluminescent devices have advantages such as lightweight, simple constitutional elements, easy fabrication process, superior image quality, and wide viewing angle. In addition, the organic electroluminescent devices can perfectly create moving pictures and produce high color purity, and have electrical properties suitable for portable electronic equipment such as low power consumption and low turn-on voltage.

The organic electroluminescent devices can be classified into low molecular-weight organic EL devices and polymer organic electroluminescent devices according to an organic layer forming material.

With respect to the low molecular-weight organic electroluminescent devices, an organic layer is formed by vacuum deposition, a light-emitting material can be easily purified in high purity, and color pixels can be easily realized. For actual application, however, there is still room for improvement in terms of enhancement in quantum efficiency and color purity, prevention of thin film crystallization, etc.

On the other hand, the polymer organic electroluminescent devices have advantages in that an organic layer can be easily formed by spin coating or printing, which simplifies a manufacturing process and decreases a manufacturing cost, and the thus-formed organic layer has good mechanical characteristics. However, there still arise problems such as bad color purity, high turn-on voltage, low efficiency, and short lifetime. Many studies for solution to these problems have been actively done.

In view of the above problems, to enhance electroluminescent characteristics, there have been developed poly(arylamines) (U.S. Pat. No. 5,728,801), fluorene-containing polymers (WO99/54385, U.S. Pat. No. 6,169,163, and Synthetic Metal, Vol. 106, pp. 115-119, 1999), and blends thereof (Applied Physics Letter, Vol. 76, No. 14, p. 1810, 2000). However, these methods also do not provide a satisfactory solution to the above-described problems facing conventional technologies.

SUMMARY OF THE INVENTION

The present invention provides an organic electroluminescent device with high color purity, low turn-on voltage, high efficiency, and long lifetime. In particular, the present invention provides a blue-emitting polymer which is improved in blue chromaticity characteristics, thereby decreasing an increase in required brightness level and thus improving lifetime reduction, and an organic EL device using the blue-emitting polymer.

According to an aspect of the present invention, there is provided a polymer represented by Formula 1:

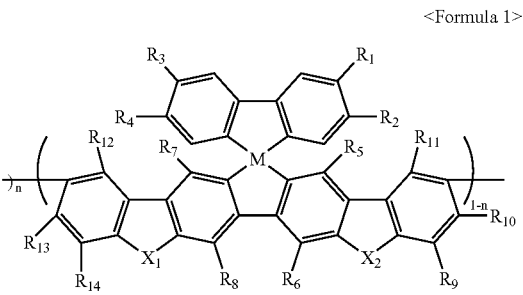

<Formula 1> wherein Ar is selected from the group consisting of a substituted or unsubstituted arylene group of C6-C30 and a substituted or unsubstituted heteroarylene group of C2-C30;

$R_1$ through $R_{14}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

$X_1$ and $X_2$ are each independently S, $NR_{15}$, $Si(R_{16}R_{17})$, or $PR_{18}$ where $R_{15}$, $R_{16}$, $R_{17}$, and $R_{18}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

M is C, Ge, Si, or Sn; and n is a real number from 0 to 0.99.

According to another aspect of the present invention, there is provided an organic electroluminescent device including an organic layer between a pair of electrodes, wherein the organic layer includes the above-described polymer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
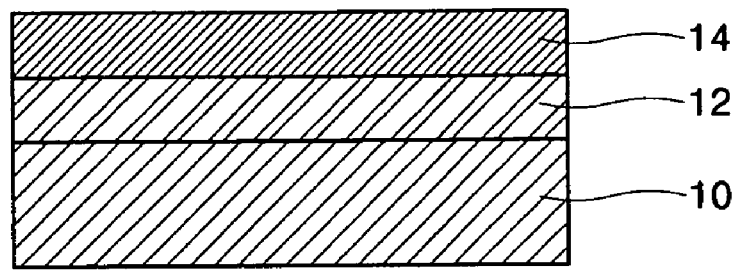
FIGS. 1A through 1F are sectional views illustrating sequentially stacked structures of layers constituting organic electroluminescent devices according to exemplary embodiments of the present invention.

The present invention will now be described more fully with reference to the accompanying drawings, in which exemplary embodiments of the invention are shown.

A polymer according to the present invention has the structure where a bisindenospirofluorene unit with good chromaticity is incorporated into a polyarylene backbone. Due to such a structural feature, the polymer according to the present invention exhibits excellent blue-emitting characteristics.

Therefore, the present invention provides a polymer represented by Formula 1:

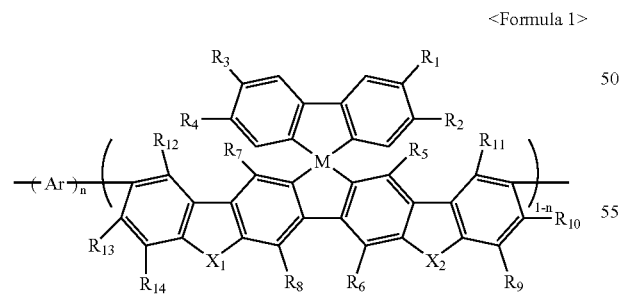

<Formula 1> wherein Ar is selected from the group consisting of a substituted or unsubstituted arylene group of C6-C30 and a substituted or unsubstituted heteroarylene group of C2-C30;

$R_1$ through $R_{14}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

$X_1$ and $X_2$ are each independently S, $NR_{15}$, $Si(R_{16}R_{17})$, or $PR_{18}$ where $R_{15}$, $R_{16}$, $R_{17}$, and $R_{18}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

M is C, Ge, Si, or Sn; and n is a real number from 0 to 0.99.

In the Formula 1, the arylene (Ar) unit may be one represented by the 16 following structural Formulae 1a through 1n:

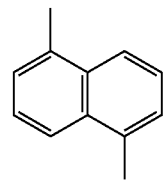

(1a)

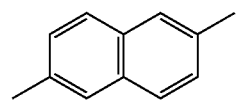

(1b)

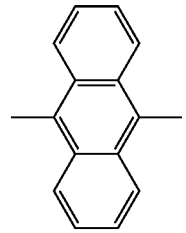

(1c)

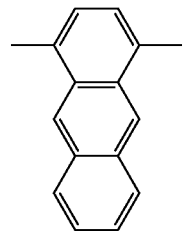

(1d)

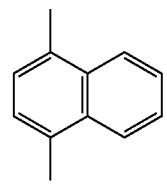

(1e)

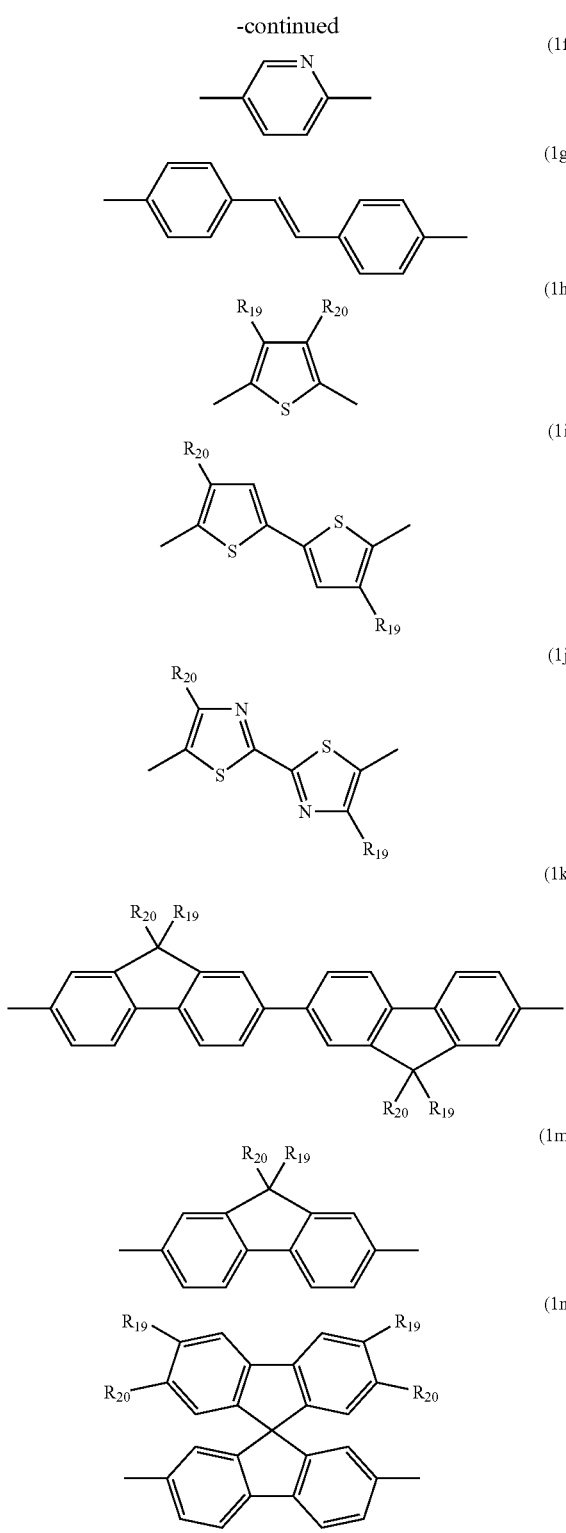

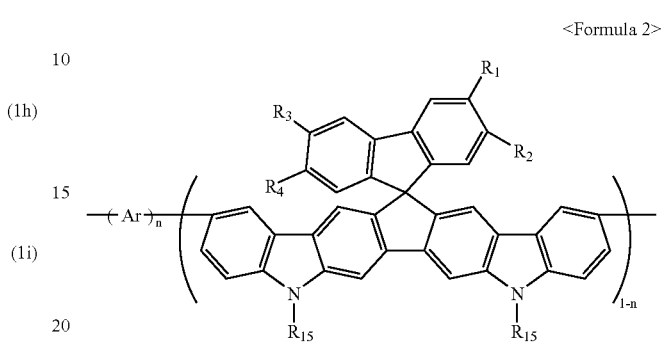

wherein $R_{19}$ and $R_{20}$ are each independently selected from the group consisting of hydrogen, a substituted or unsubstituted alkyl group of C1-C12, a substituted or unsubstituted alkoxy group of C1-C12, and a substituted or unsubstituted amino group.

An Ar unit having a spirofluorene structure represented by the Formula 1n is more preferable as the Ar unit constituting the backbone of the polymer of the present invention because it provides high thermal stability, and prevents excimer formation with an adjacent chain, thereby ensuring high efficiency and high color purity.

Preferably, the polymer of the Formula 1 is a polymer represented by Formula 2:

<Formula 2> wherein Ar, $R_1$ through $R_4$, and n are as defined in the Formula 1; and each $R_{15}$ is independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30.

Examples of the unsubstituted alkyl group as used herein include methyl, ethyl, propyl, isobutyl, sec-butyl, tert-butyl, pentyl, iso-amyl, and hexyl. One or more hydrogen atoms on the alkyl group may be substituted by a halogen atom, a hydroxy group, a nitro group, a cyano group, a substituted or unsubstituted amino group (e.g., —$NH_2$, —NH(R), or —N(R')(R'') where R, R' and R'' are each independently an alkyl group of 1-10 carbon atoms), an amidino group, hydrazine, hydrazone, a carboxyl group, a sulfonyl group, a phosphonyl group, an alkyl group of C1-C20, a halogenated alkyl group of C1-C20, an alkenyl group of C1-C20, an alkynyl group of C1-C20, a heteroalkyl group of C1-C20, an aryl group of C6-C20, an arylalkyl group of C6-C20, a heteroaryl group of C6-C20, or a heteroarylalkyl group of C6-C20.

The unsubstituted cycloalkyl group as used herein includes a monovalent monocyclic system containing 5-30 carbon atoms. One or more hydrogen atoms on the cycloalkyl group may be substituted by the same substituents as those mentioned in the alkyl group.

The unsubstituted aryl group as used herein includes a carbocyclic aromatic system containing one or more rings. The rings may be attached to each other as a pendant group or may be fused. Examples of the aryl group include aromatic groups such as phenyl, naphthyl, and tetrahydronaphthyl. One or more hydrogen atoms on the aryl group may be substituted by the same substituents as those mentioned in the alkyl group.

The unsubstituted arylalkyl group as used herein includes a lower alkyl, for example, methyl, ethyl, or propyl appended to the aryl defined above. Examples of the arylalkyl group include benzyl and phenylethyl. One or more hydrogen atoms on the arylalkyl group may be substituted by the same substituents as those mentioned in the alkyl group.

The unsubstituted trialkylsilyl group as used herein includes three alkyl groups as defined above, attached to a silicon atom. Examples of the trialkylsilyl group include a trimethylsilyl group and a triethylsilyl group. One or more hydrogen atoms on the trialkylsilyl group may be substituted by the same substituents as those mentioned in the alkyl group.

Examples of the unsubstituted alkoxy group as used herein include methoxy, ethoxy, propoxy, isobutyloxy, sec-butyloxy, pentyloxy, iso-amyloxy, and hexyloxy. One or more hydrogen atoms on the alkoxy group may be substituted by the same substituents as those mentioned in the alkyl group.

Examples of the unsubstituted aryloxy group as used herein include phenyloxy and naphthyloxy. One or more hydrogen atoms on the aryloxy group may be substituted by the same substituents as those mentioned in the alkyl group.

The unsubstituted heteroaryl group as used herein includes a cyclic aromatic system of 5-30 carbon atoms containing one, two or three hetero atoms selected from N, O, P and S. Rings of the heteroaryl group may be attached to each other as a pendant group or may be fused. One or more hydrogen atoms on the heteroaryl group may be substituted by the same substituents as those mentioned in the alkyl group.

The unsubstituted heteroarylalkyl group as used herein includes a lower alkyl group appended to the heteroaryl as defined above. One or more hydrogen atoms on the heteroarylalkyl group may be substituted by the same substituents as those mentioned in the alkyl group.

Examples of the unsubstituted heteroaryloxy group as used herein include benzyloxy and phenylethyloxy. One or more hydrogen atoms on the heteroaryloxy group may be substituted by the same substituents as those mentioned in the alkyl group.

The unsubstituted heterocycloalkyl group as used herein includes a monovalent monocyclic system of 5-30 carbon atoms containing one, two or three hetero atoms selected from N, O, P and S. One or more hydrogen atoms on the heterocycloalkyl group may be substituted by the same substituents as those mentioned in the alkyl group.

The amino group as used herein includes —NH$_2$, —NH(R), or —N(R')(R") where R, R' and R" are each independently an alkyl group of 1-10 carbon atoms.

A weight average molecular weight (Mw) of a polymer according to the present invention plays an important role in characteristics of a thin layer made of the polymer and lifetime of a device including the thin layer. In this regard, it is preferable that a blue-emitting polymer according to the present invention has Mw of about 10,000 to 2,000,000.

If the Mw of the polymer is less than 10,000, crystallization of a thin film may occur upon device manufacturing or driving. On the other hand, a polymer with Mw of above 2,000,000 may not be easily synthesized using a common Pd(O)- or Ni(O)-mediated aryl coupling reaction and may be undesirable in terms of emission characteristics of an organic EL device.

In addition, it is advantageous that a molecular weight distribution (MWD) of a polymer according to the present invention is as narrow as possible in terms of EL characteristics (in particular, lifetime) of an organic EL device. In this regard, it is preferable that the MWD of a polymer according to the present invention is in the range from 1 to 5.

Hereinafter, an organic EL device using the above-described polymer of the Formula 1 and a method of manufacturing the same will be described.

FIGS. 1A through 1F are sectional views illustrating sequentially stacked structures of layers constituting organic EL devices according to exemplary embodiments of the present invention.

Referring to FIG. 1A, a light-emitting layer 12 including a blue-emitting polymer of Formula 1 is formed on a first electrode 10, and a second electrode 14 is formed on the light-emitting layer 12.

Figure 1B:
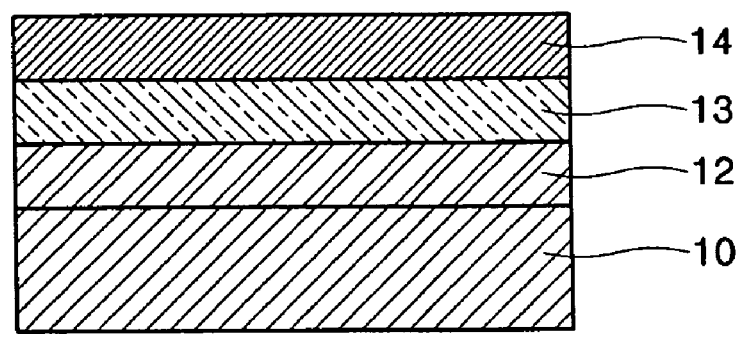

Referring to FIG. 1B, a light-emitting layer 12 including a blue-emitting polymer of Formula 1 is formed on a first electrode 10, a hole blocking layer (HBL) 13 is formed on the light-emitting layer 12, and a second electrode 14 is formed on the hole blocking layer 13.

Figure 1C:
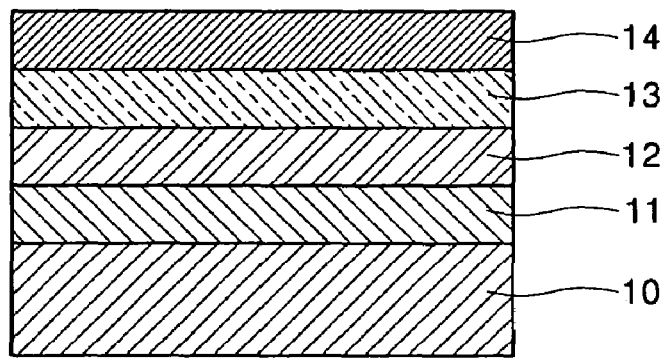

Referring to FIG. 1C, an organic EL device includes a hole injection layer (HIL) (also called "buffer layer") 11 between a first electrode 10 and a light-emitting layer 12.

Figure 1D:
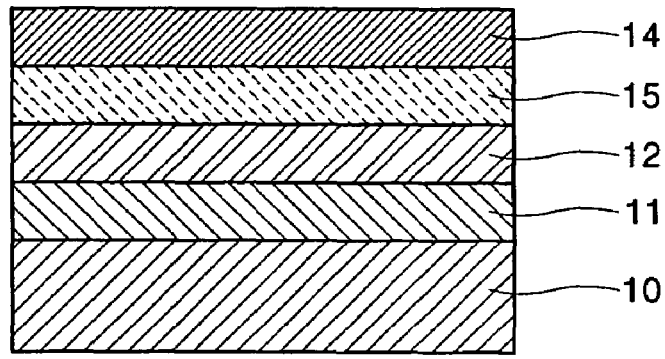

Referring to FIG. 1D, an organic EL device has the same structure as that of FIG. 1C except that an electron transport layer (ETL) 15 is formed on a light-emitting layer 12.

Figure 1E:
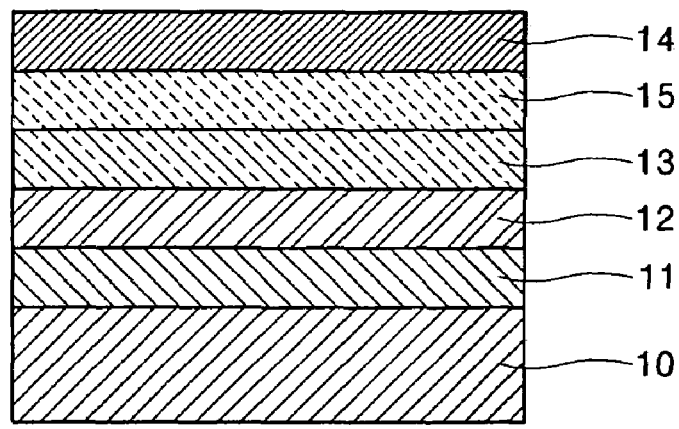

Referring to FIG. 1E, an organic EL device has the same structure as that of FIG. 1C except that a bi-layered film obtained by sequentially stacking a hole blocking layer 13 and an electron transport layer 15 is formed on a light-emitting layer 12 including a blue-emitting polymer of Formula 1.

Figure 1F:
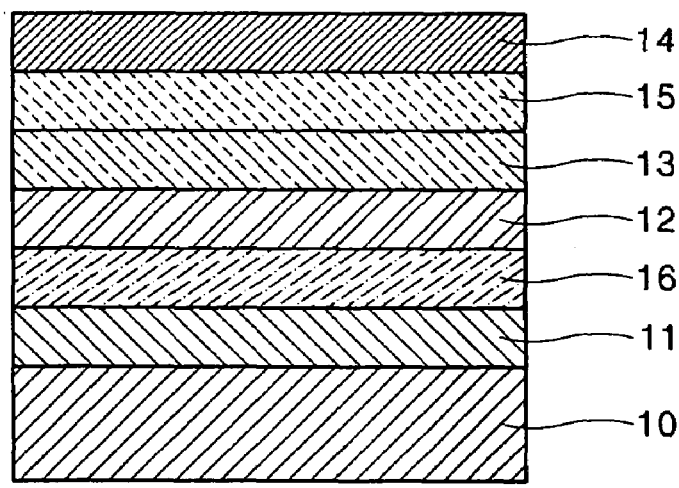

Referring to FIG. 1F, an organic EL device has the same structure as that of FIG. 1E except that a hole transport layer 16 is formed between a hole injection layer 11 and a light-emitting layer 12. Here, the hole transport layer 16 serves to prevent impurity diffusion from the hole injection layer 11 to the light-emitting layer 12.

The above-described organic EL devices having the stacked structures of FIGS. 1A through 1F can be manufactured by a non-limiting common manufacturing method.

A method of manufacturing an organic EL device according to an exemplary embodiment of the present invention will now be described.

First, a first electrode is formed on a substrate. Here, the substrate may be a substrate commonly used for organic EL devices. Preferably, the substrate is a glass substrate or a transparent plastic substrate which is excellent in transparency, surface smoothness, handling property, and water resistance. Preferably, the substrate has a thickness of 0.3 to 1.1 mm.

A material for the first electrode is not particularly restricted. If the first electrode is an anode, it may be made of a conductive metal or its oxide with good hole injection capability, for example, ITO (Indium Tin Oxide), IZO (Indium Zinc Oxide), nickel (Ni), platinum (Pt), gold (Au), or iridium (Ir).

The substrate covered with the first electrode is subjected to cleaning and UV/ozone treatment. At this time, an organic solvent such as isopropanol (IPA) or acetone is used as a cleaning solvent.

Next, a hole injection layer is selectively formed on the first electrode. The hole injection layer reduces a contact resistance between the first electrode and a light-emitting layer as will be described later, and at the same time enhances the hole transport capability of the first electrode to the light-emitting layer, thereby wholly improving the turn-on voltage and lifetime characteristics of an organic EL device. A material for the hole injection layer is not particularly restricted provided that it is a material commonly used in the pertinent art. Examples of the hole injection layer material include PEDOT {poly(3,4-ethylenedioxythiophene)}/PSS (polystyrene parasulfonate), Starburst-based compounds, copper phthalocyanine, polythiophene, polyaniline, polyacetylene, polypyrrole, polyphenylene vinylene, and derivatives thereof. The hole injection layer is formed by spin-coating and drying of the hole injection layer material on the first electrode. A thickness of the hole injection layer may be in the range from 300 to 2,000 Å, more preferably from 500 to 1,100 Å. If the thickness of the hole injection layer is outside the above range, hole injection capability may be lowered. The drying temperature may be in the range from 100 to 250° C.

The light-emitting layer is formed on the hole injection layer by spin-coating and drying of a light-emitting layer forming composition. Here, the light-emitting layer forming composition includes 0.01 to 10 wt % of a polymer of Formula 1 and a solvent.

The solvent is not particularly restricted provided that it can dissolve a light-emitting polymer. For example, the solvent may be toluene, chlorobenzene, etc.

In some cases, the light-emitting layer forming composition may further include a dopant. The content of the dopant may vary according to a light-emitting layer forming material but may be in the range from 30 to 80 parts by weight based on 100 parts by weight of a common light-emitting layer forming material, i.e., based on the total weight of a host and a dopant. If the content of the dopant is outside the above range, emission characteristics of an organic EL device may be lowered. Examples of the dopant include arylamines, perylenes, pyrroles, hydrazones, carbazoles, stilbenes, Starburst compounds, and oxadiazoles.

It is preferable to adjust the thickness of the light-emitting layer to a range from 100 to 1,000 Å, more preferably from 500 to 1,000 Å, by adjusting the concentration of the light-emitting layer forming composition and a spin-coating speed. If the thickness of the light-emitting layer is less than 100 Å, emission efficiency may be lowered. On the other hand, if it exceeds 1,000 Å, a turn-on voltage may be increased.

A hole transport layer may be selectively formed between the hole injection layer and the light-emitting layer. A hole transport layer forming material is not particularly restricted provided that it has satisfactory hole transport capability. The hole transport layer forming material may be polytriphenylamine, etc. A thickness of the hole transport layer may be in the range from 100 to 1,000 Å.

A hole blocking layer and/or an electron transport layer is/are formed on the light-emitting layer by deposition or spin-coating. Here, the hole blocking layer serves to prevent the transfer of excitons generated in a light-emitting material to the electron transport layer and hole transfer to the electron transport layer.

A material for the hole blocking layer may be selected from LiF, MgF$_2$, phenanthrolines (e.g.: BCP, UDC), imidazoles, triazoles, oxadiazoles (e.g.: PBD), and aluminum complexes such as BAlq (UDC), as illustrated by the following structural formulae:

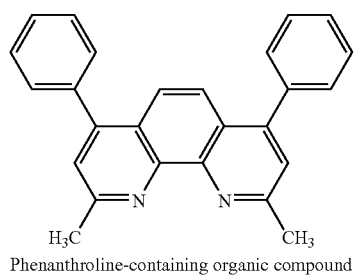

Phenanthroline-containing organic compound

-continued

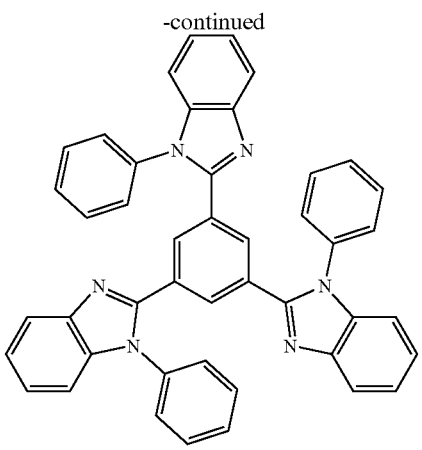

Imidazole-containing organic compound

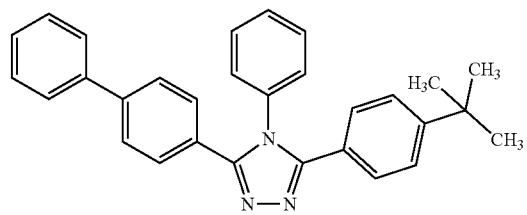

Triazole-containing organic compound

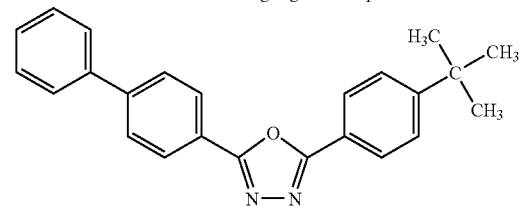

Oxadiazole-containing compound

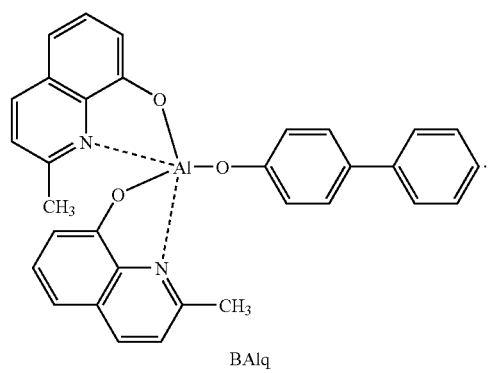

BAlq

A material for the electron transport layer may be selected from oxadiazoles, isoxazoles, triazoles, isothiazoles, oxadiazoles, thiadiazoles, perylenes, aluminum complexes (e.g.: Alq3 (tris(8-quinolinolato)-aluminium), BAlq, SAlq, Almq3), and gallium complexes (e.g.: Gaq'2OPiv, Gaq'2OAc, 2(Gaq'2)), as illustrated by the following structural formulae:

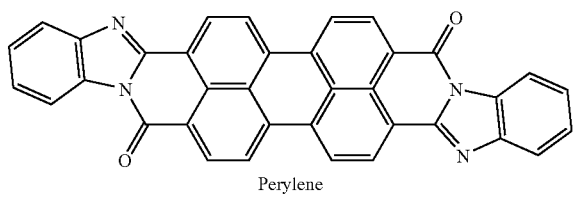
Perylene

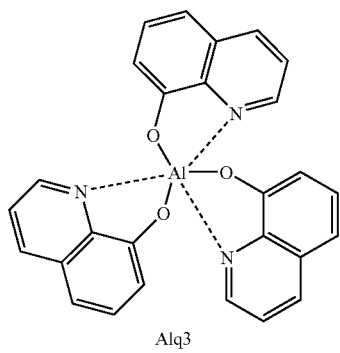
Alq3

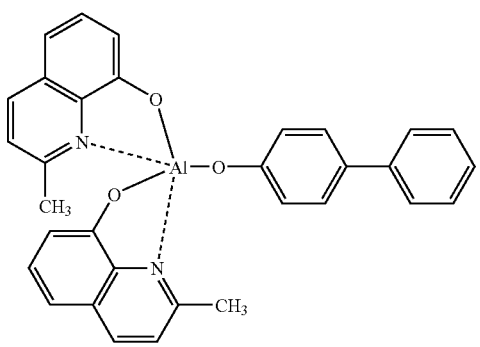
BAlq

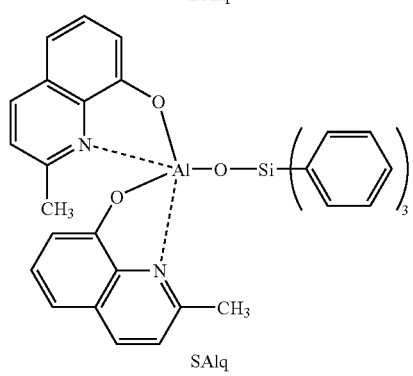
SAlq

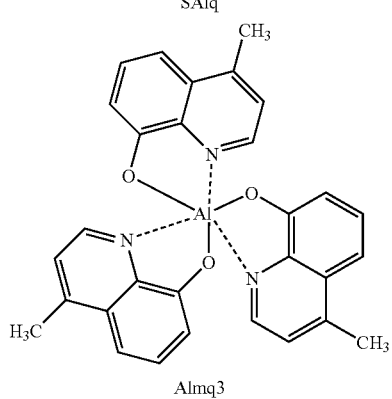
Almq3

-continued

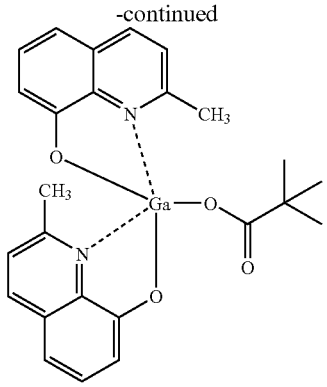
Gaq'2OPiv

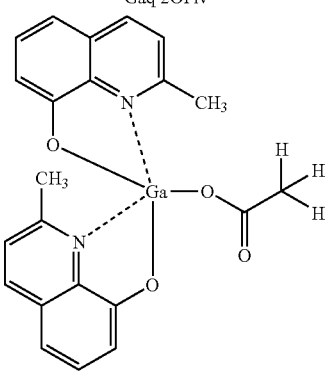
Gaq'2OAc

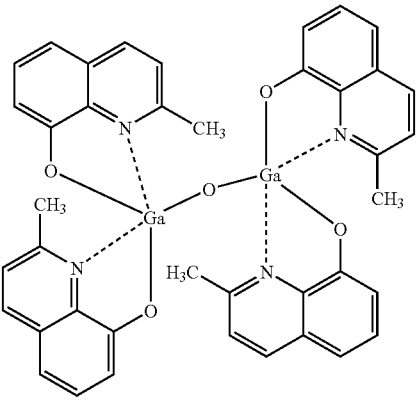
2(Gaq'2)

Preferably, a thickness of the hole blocking layer is in the range from 100 to 1,000 Å, and a thickness of the electron transport layer is in the range from 100 to 1,000 Å. If the thickness of the hole blocking layer or the electron transport layer is outside the above range, electron transport capability or hole blocking capability may be lowered.

A second electrode is formed on the resultant structure followed by sealing to thereby complete an organic EL device.

A material for the second electrode is not particularly restricted but may be a low work function metal, i.e., Li, Ca, Ca/Al, LiF/Ca, LiF/Al, Al, Mg, or Mg alloy. Preferably, a thickness of the second electrode is in the range from 50 to 3,000 Å.

In the above-described organic EL device manufacturing, a polymer of Formula 1 according to the present invention is used as a light-emitting layer forming material. However, the polymer of Formula 1 can also be used as a hole transport layer forming material and as an intermediate in the biotechnology art due to its chemical characteristics.

An organic EL device according to the present invention can be manufactured according to a common organic EL device manufacturing method using a light-emitting polymer without requiring a specific apparatus or method.

Hereinafter, the present invention will be described more specifically with reference to the following examples. The following examples are for illustrative purposes and are not intended to limit the scope of the invention.

SYNTHESIS EXAMPLE 1

Synthesis of Monomer

A compound (E') was synthesized according to the following reaction scheme:

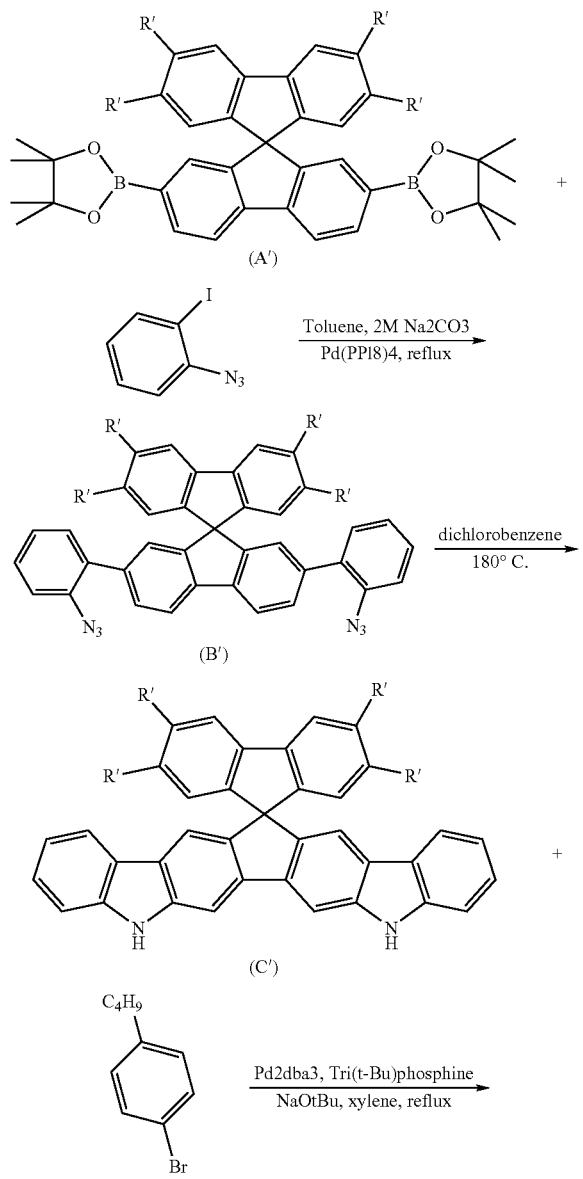

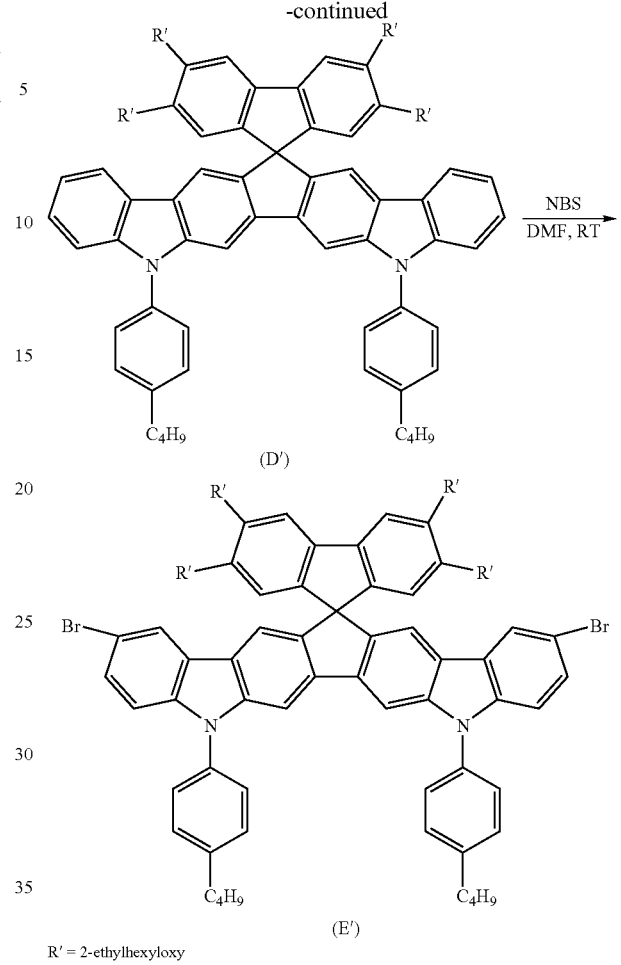

R' = 2-ethylhexyloxy a) Synthesis of Compound (B')

40.31 g (37.3 mmol) of a compound (A'), 18.27 g (74.56 mmol) of 1-azido-2-iodobenzene, and 5 mol % 8.62 g (7.46 mmol) of palladium tetrakistriphenylphosphine (Pd(PPh$_3$)$_4$) were dissolved in 200 ml of toluene and 100 ml of 2M Na$_2$CO$_3$ was added thereto. The resultant mixture was refluxed for 12 hours.

After the reaction was terminated, an organic layer was separated from the reaction solution, concentrated, and purified by column chromatography with hexane. As a result, 36.46 g (34.3 mmol) (yield: 92%) of a compound (B') was obtained.

b) Synthesis of Compound (C')

19.9 g (18.7 mmol) of the compound (B') was dissolved in 100 ml of ortho-dichlorobenzene and refluxed at 180° C. for 12 hours.

After the reaction was terminated, the resultant solution was concentrated under a reduced pressure and purified by column chromatography with toluene as an eluent to give 7.34 g (yield: 39%) of [12,12-dioctyl-6,12-dihydro-6-azaindeno[1,2]-b]fluorene (compound (C')).

c) Synthesis of Compound (D')

9.22 g (9.16 mmol) of the compound (C'), 2.29 g of 1-bromo-4-butylbenzene, 0.18 g of tris(dibenzylideneacetone)di-palladium (0) (Pd2dba3), 1.28 g of sodium t-butoxide (t-BuONa), and 0.003 g of tris(t-butyl)phosphine were dissolved in 50 ml of xylene and refluxed at 120° C. for 24 hours.

After the reaction was terminated, a solvent was removed from the reaction solution and the resultant fraction was purified by column chromatography with toluene/hexane (1/3, v/v) as an eluent to give 8.73 g (yield: 79%) of a compound (D').

d) Synthesis of Compound (E')

7.11 g (5.89 mmol) of a compound (D') was dissolved in 150 ml of dimethylformamide (DMF) to obtain a compound (D') solution. Then, a solution obtained by dissolving 2.12 g (11.93 mmol) of N-bromosuccinimide (NBS) in 30 ml of DMF was gradually dropwise added to the compound (D') solution and incubated at room temperature for 6 hours.

After the reaction was terminated, the resultant solution was neutralized with a 2M potassium carbonate solution, and extracted with water and chloroform to separate a chloroform layer. A solvent was removed from the chloroform layer, and the resultant fraction was purified by column chromatography with toluene/hexane (1/3, v/v) as an eluent to give 3.21 g (yield: 40%) of a compound (E').

SYNTHESIS EXAMPLE 2

Synthesis of Polymer of Formula 2a

A polymer of Formula 2a was synthesized according to the following reaction scheme:

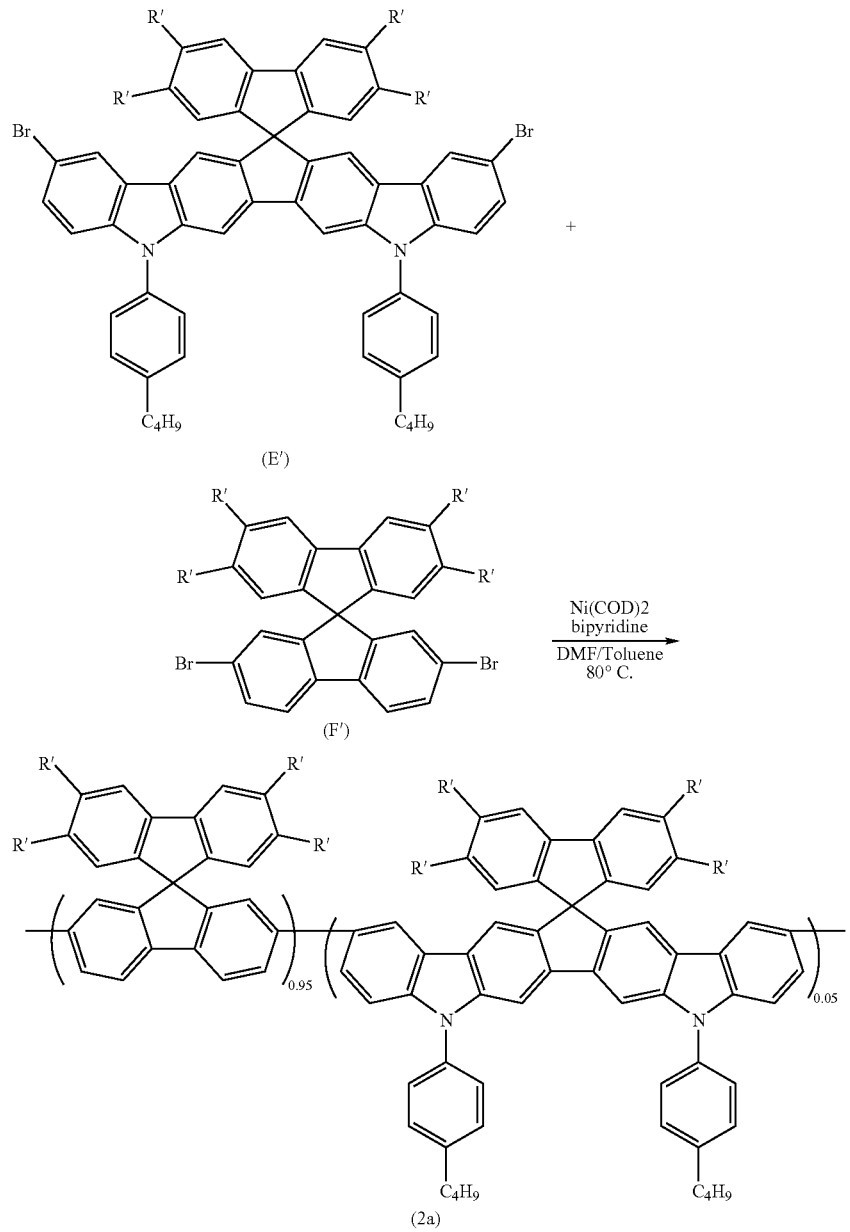

R' = 2-ethylhexyloxy

A Schlenk flask was several times subjected to evacuation and nitrogen reflux to completely remove moisture and then transferred into a glove box. Then, 558 mg (2.03 mmol) of bis(1,5-cyclooctadiene)nickel (Ni(COD)$_2$) and 317 mg (2.03 mmol) of bipyridine were added to the Schlenk flask and then several times subjected to evacuation and nitrogen reflux. Then, 10 ml of anhydrous DMF, 219 mg (2.03 mmol) of 1,5-cyclooctadiene (COD), and 10 ml of anhydrous toluene were added to the resultant solution under nitrogen atmosphere and stirred at 80° C. for 30 minutes. To the resultant solution, there was added a diluted solution obtained by diluting 36.4 mg (0.0267 mmol) of the compound (E') and 500 mg (0.507 mmol) of a compound (F') with 10 ml of toluene. 10 ml of toluene was added to the Schlenk flask with washing the inner wall of the flask and then the resultant mixture was stirred at 80° C. for 4 days.

After the reaction was terminated, the resultant solution was cooled to room temperature and poured into a mixed solution of hydrochloric acid (HCl), acetone, and methanol (1:1:2, by volume) to obtain a precipitate. The precipitate was dissolved in chloroform and poured into methanol to form a precipitate. The precipitate was subjected to a soxhlet extraction to give 450 mg of a polymer of Formula 2a. The polymer was analyzed by gel permeation chromatography (GPC). As a result, the weight average molecular weight (Mw) was 245,000 and the molecular weight distribution (MWD) was 2.02.

Figure 2:
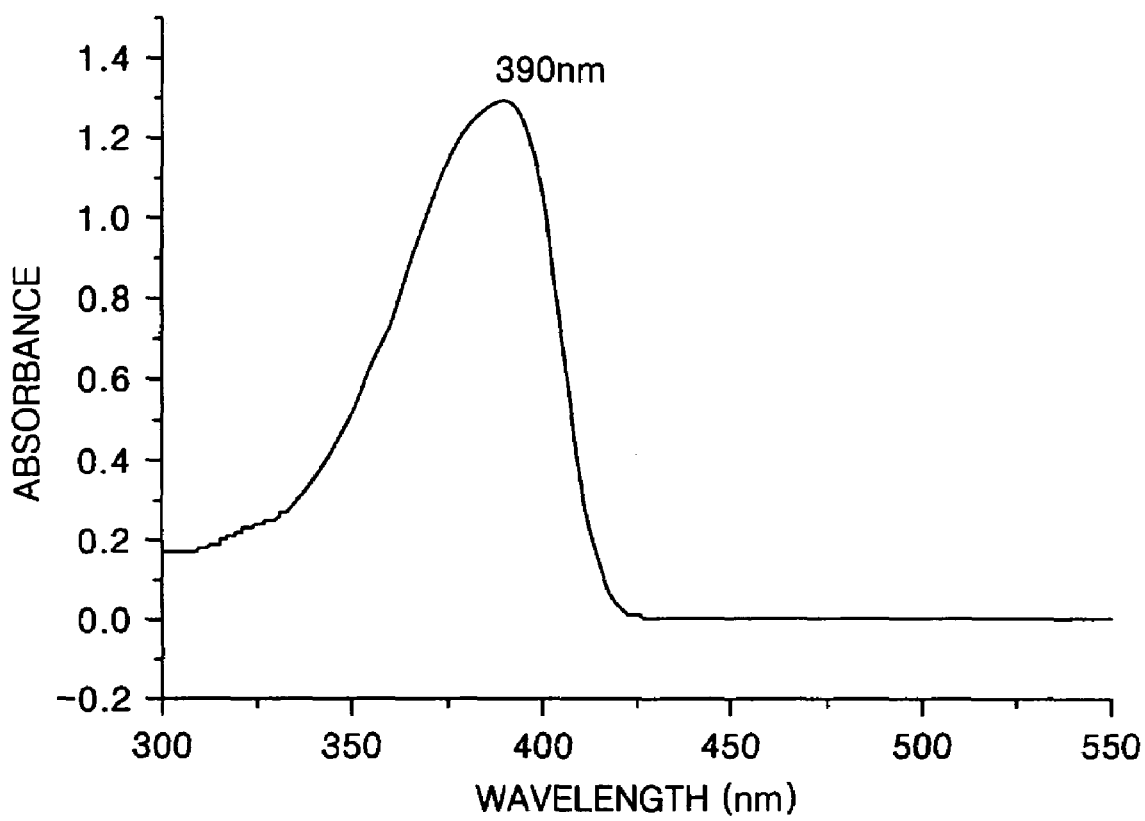
FIG. 2 is a graph illustrating a UV-Vis absorption spectrum of a polymer prepared in Synthesis Example 2 according to the present invention.
Figure 3:
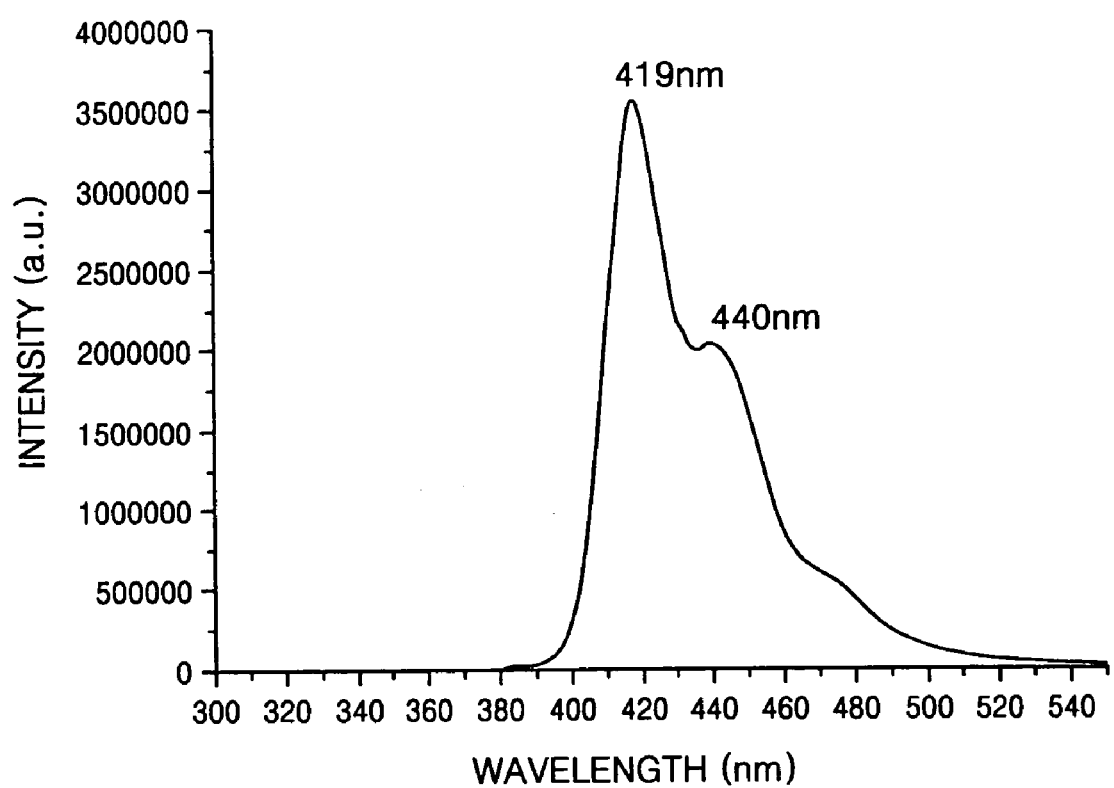
FIG. 3 is a graph illustrating an emission spectrum of a solution state of the polymer prepared in Synthesis Example 2 according to the present invention.
Figure 4:
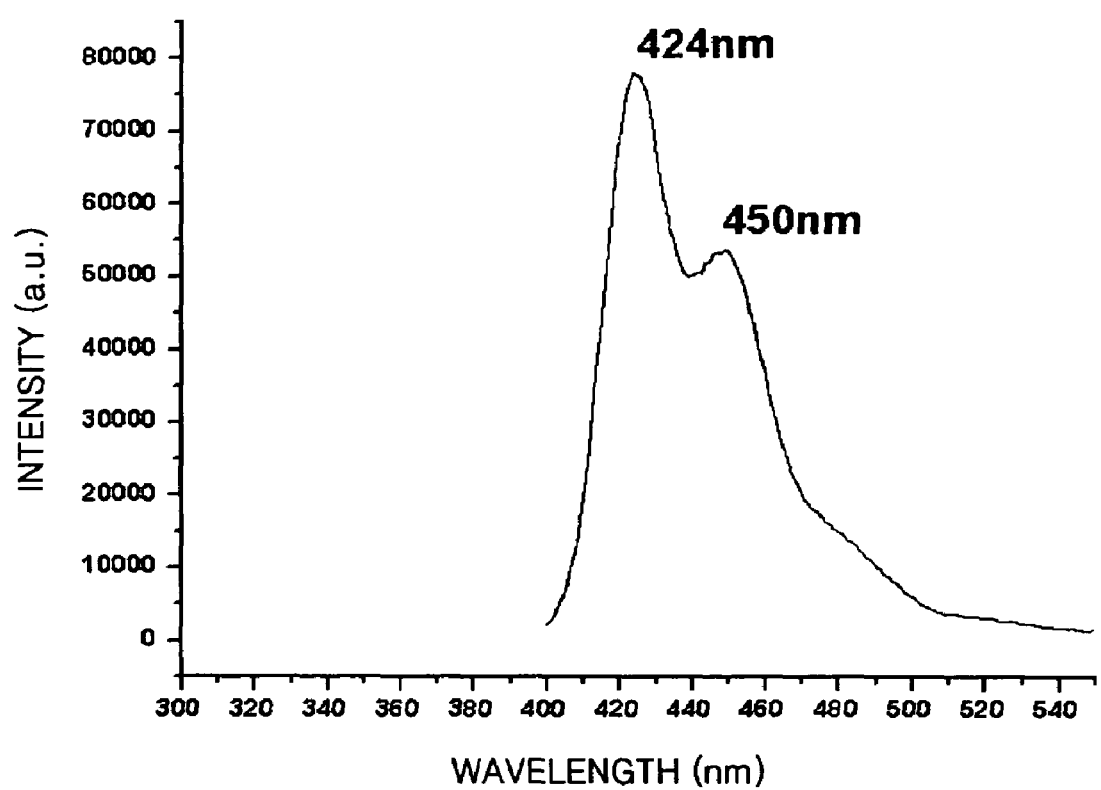
FIG. 4 is a graph illustrating an emission spectrum of a film state of the polymer prepared in Synthesis Example 2 according to the present invention.

FIGS. 2 through 4 illustrate the UV-Vis absorption spectrum (FIG. 2), the emission spectrum of a solution state (FIG. 3), and the emission spectrum of a film state (FIG. 4) of the polymer synthesized in Synthesis Example 2, respectively.

Referring to FIGS. 2 through 4, it can be seen that the polymer synthesized in Synthesis Example 2 is a blue electroluminescent material.

EXAMPLE 1

Manufacturing of Organic EL Device

An organic EL device was manufactured using the polymer synthesized in Synthesis Example 2 as follows.

First, a transparent electrode substrate in which ITO was coated on a glass substrate was thoroughly cleaned, patterned in a desired shape using a photoresist resin and an ethant, and again thoroughly cleaned. Batron P 4083 (Bayer) was coated on the patterned transparent electrode substrate to form a conductive buffer layer with a thickness of about 800 Å and then baked at 110° C. for about one hour. Then, an interlayer was formed to a thickness of 200 Å using a solution of 0.8 wt % of poly[9,9-dioctylfluorene-co-(N,N'-bis-(4-butylphenyl)-N,N'-diphenyl-benzene-1,4-diamine] in 99.2 wt % of m-xylene and baked at 230° C. for about 15 minutes. Then, a light-emitting layer forming polymer solution obtained by dissolving 0.8 wt % of the polymer synthesized in Synthesis Example 2 in 99.2 wt % of m-xylene was spin-coated on the buffer layer and baked. Then, the resultant structure was transferred into a vacuum oven to form a polymer layer with complete removal of a solvent. At this time, the polymer solution was filtered with a 0.45 μm filter before the spin-coating, and the thickness of the polymer layer was adjusted to about 80 nm by adjusting the concentration of the polymer solution and a spin-coating speed.

Next, Ca and Al were sequentially deposited on the polymer layer while maintaining a vacuum of 4×10$^{-6}$ torr or less using a vacuum depositor to thereby complete an organic EL device. Upon the deposition, a film thickness and a film growth rate were adjusted using a crystal sensor.

Figure 5:
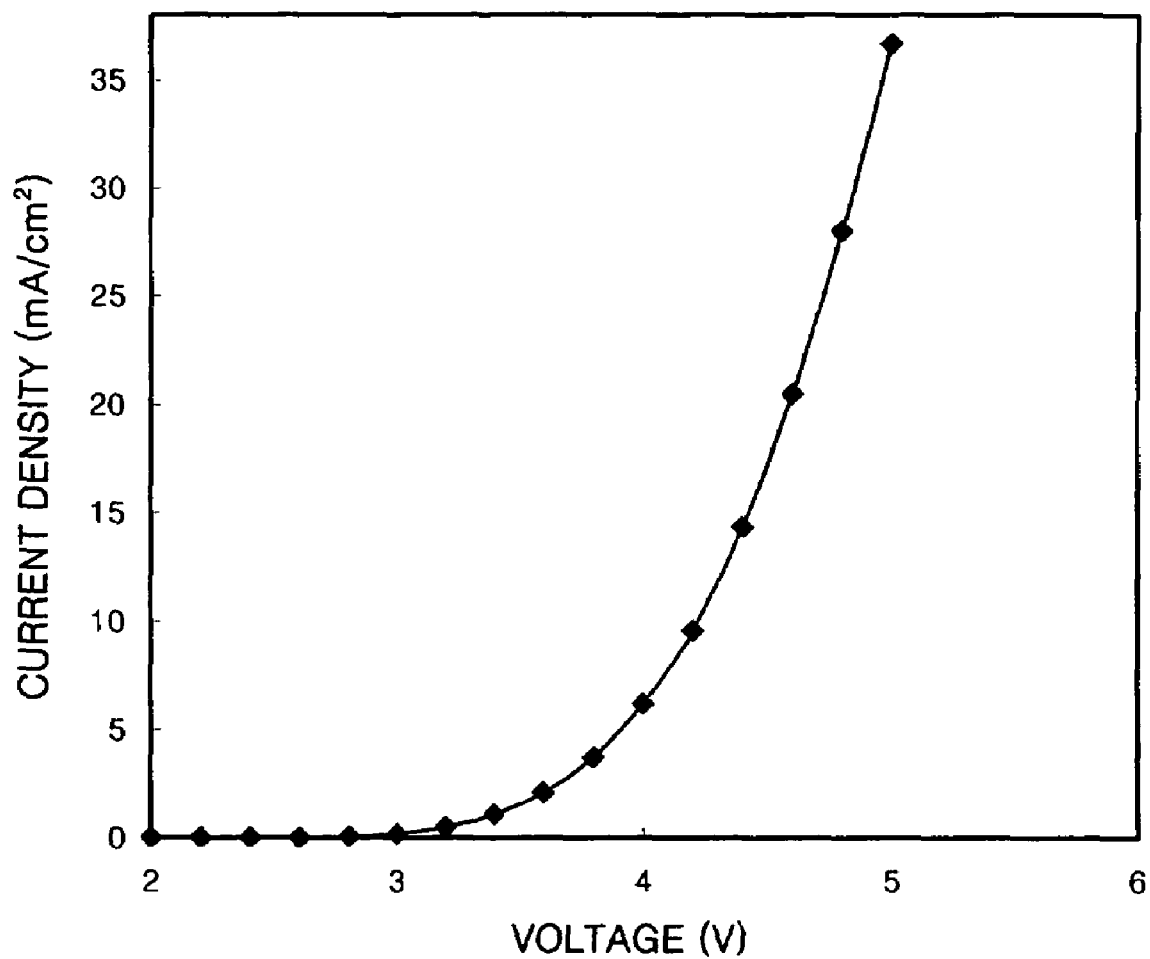
FIG. 5 is a graph illustrating current-voltage characteristics of an organic electroluminescent device manufactured in Example 1 according to the present invention.
Figure 6:
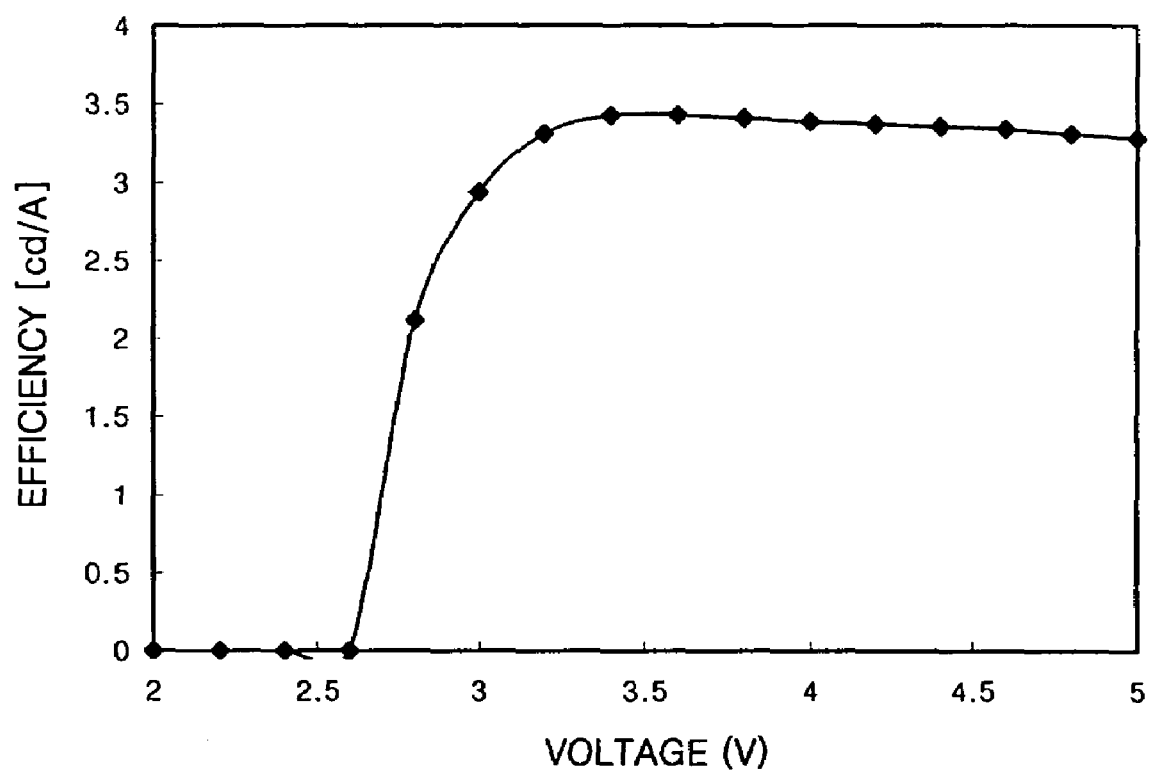
FIG. 6 is a graph illustrating efficiency-voltage characteristics of the organic electroluminescent device manufactured in Example 1 according to the present invention.
Figure 7:
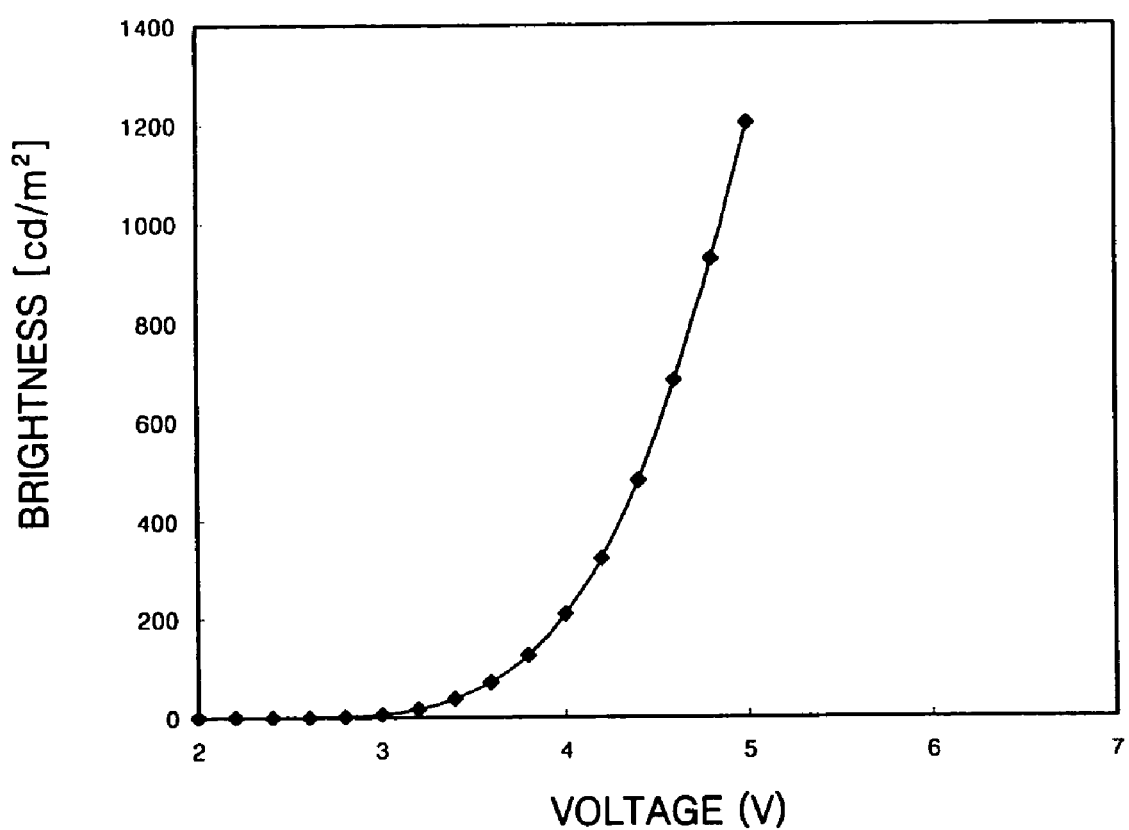
FIG. 7 is a graph illustrating brightness-voltage characteristics of the organic electroluminescent device manufactured in Example 1 according to the present invention.

The current-voltage characteristics, efficiency-voltage characteristics, and brightness-voltage characteristics of the organic EL device manufactured in Example 1 were evaluated, and the results are shown in FIGS. 5 through 7. FIGS. 5 through 7 illustrate the current-voltage characteristics (FIG. 5), the efficiency-voltage characteristics (FIG. 6), and the brightness-voltage characteristics (FIG. 7) of the organic EL device manufactured in Example 1 according to the present invention.

Here, a forward bias voltage was used as a turn-on voltage, and the organic EL device of Example 1 revealed typical rectifying diode characteristics. In particular, the organic EL device of Example 1 exhibited excellent stability keeping initial voltage-current characteristics during repeated turn on and off cycling. Efficiency and brightness characteristics were also excellent.

Figure 8:
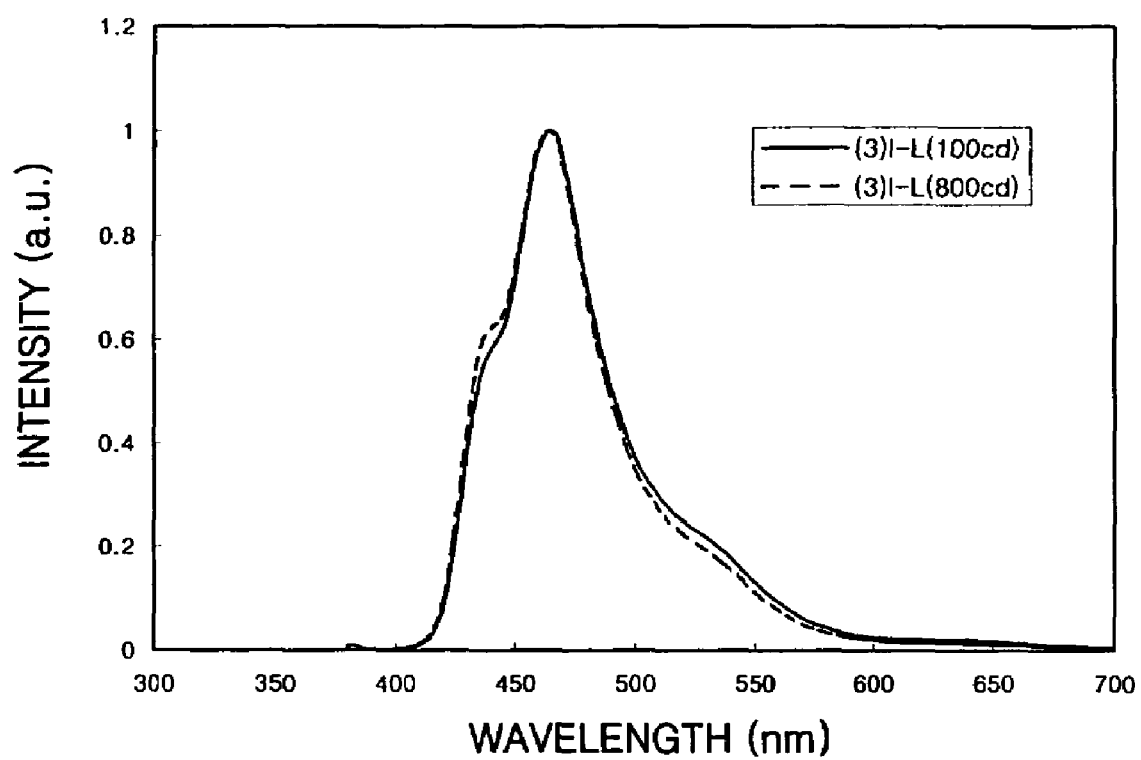
FIG. 8 is a graph illustrating an electroluminescent spectrum of the organic electroluminescent device manufactured in Example 1 according to the present invention.

FIG. 8 is a graph illustrating the EL spectrum of the organic EL device manufactured in Example 1 of the present invention. Referring to FIG. 8, the organic EL device according to the present invention exhibited high purity, blue-emitting characteristics, and in particular did not undergo a change in color purity at a brightness level of 100 or 800 cd/m$^2$ due to good color stability.

The present invention provides a blue-emitting polymer with high color purity, low turn-on voltage, high efficiency, and long lifetime, and an organic EL device using the same. In particular, the blue-emitting polymer exhibits improved blue chromaticity characteristics and decreases an increase in required brightness level. Therefore, the organic EL device using the blue-emitting polymer can have an extended lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polymer represented by Formula 1:

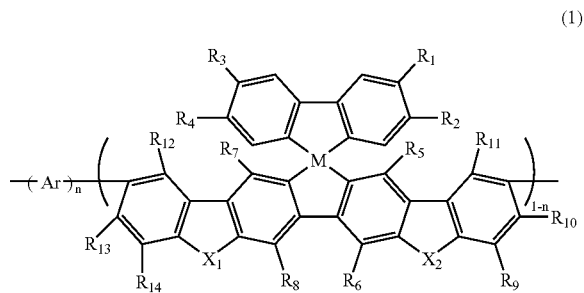

(1)

wherein Ar is selected from the group consisting of a substituted or unsubstituted arylene group of C6-C30 and a substituted or unsubstituted heteroarylene group of C2-C30;

$R_1$ through $R_{14}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

$X_1$ and $X_2$ are each independently S, $NR_{15}$, $Si(R_{16}R_{17})$, or $PR_{18}$ where $R_{15}$, $R_{16}$, $R_{17}$, and $R_{18}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

M is C, Ge, Si, or Sn; and n is a real number from 0 to 0.99.

2. The polymer of claim 1, wherein the Ar unit of the Formula 1 is represented by one selected from the group consisting of Formulae 1a through 1n:

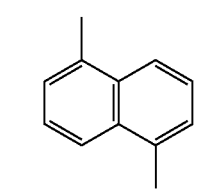
(1a)

(1b)

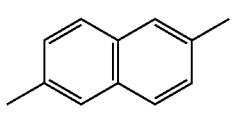

(1c)

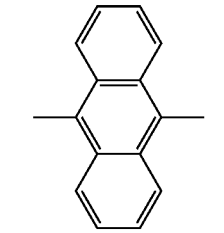

(1d)

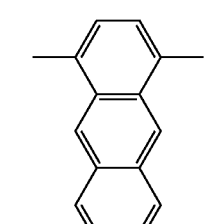

(1e)

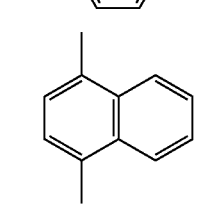

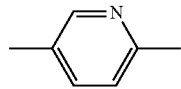
(1f)

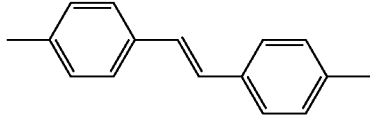
(1g)

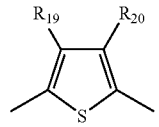
(1h)

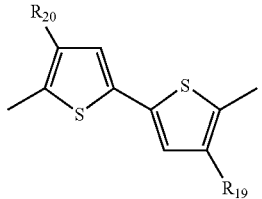
(1i)

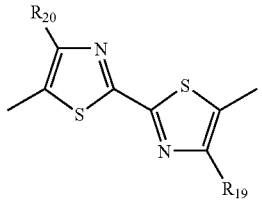
(1j)

(1k)

(1m)

(1n)

wherein $R_{19}$ and $R_{20}$ are each independently selected from the group consisting of hydrogen, a substituted or unsubstituted alkyl group of C1-C12, a substituted or unsubstituted alkoxy group of C1-C12, and a substituted or unsubstituted amino group.

3. The polymer of claim 2, wherein the Ar unit of the Formula 1 is represented by the Formula 1n:

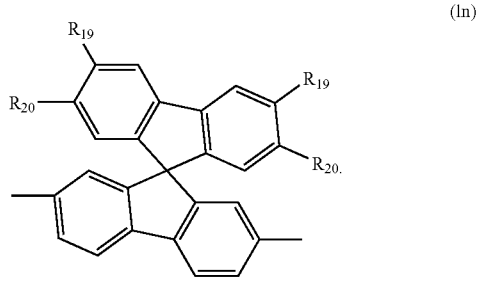

(1n)

4. The polymer of claim 1, which is represented by Formula 2:

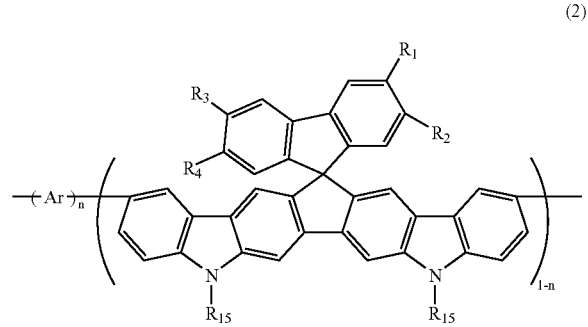

(2)

wherein each $R_{15}$ is independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30.

5. The polymer of claim 1, which has a weight average molecular weight (Mw) of 10,000 to 2,000,000, and a molecular weight distribution (MWD) of 1 to 5.

6. The polymer of claim 1, which is represented by Formula 2a:

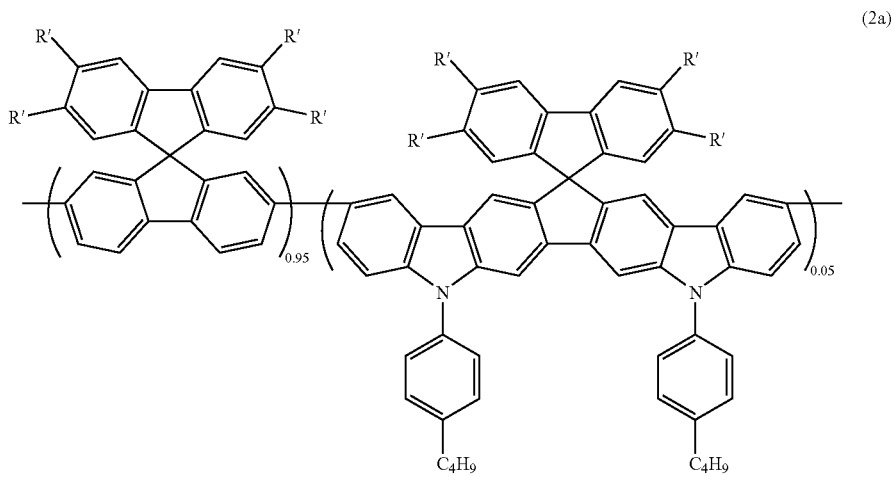

(2a)

where R' is 2-ethylhexyloxy.

7. An organic electroluminescent device having an organic layer comprising the polymer of claim 1.

8. A method of forming an organic electroluminescent device, the method comprising utilizing the polymer of claim 1.

9. An organic electroluminescent device, comprising:
a pair of electrodes; and
an organic layer between the pair of electrodes, the organic layer comprising a polymer represented by Formula 1:

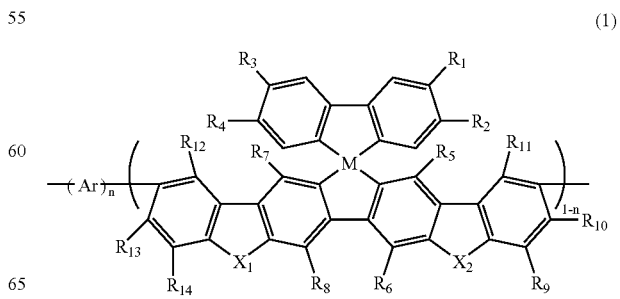

(1)

wherein Ar is selected from the group consisting of a substituted or unsubstituted arylene group of C6-C30 and a substituted or unsubstituted heteroarylene group of C2-C30;

$R_1$ through $R_{14}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

$X_1$ and $X_2$ are each independently S, $NR_{15}$, $Si(R_{16}R_{17})$, or $PR_{18}$ where $R_{15}$, $R_{16}$, $R_{17}$, and $R_{18}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

M is C, Ge, Si, or Sn; and n is a real number from 0 to 0.99.

10. The organic electroluminescent device of claim 9, wherein the Ar unit of the Formula 1 is represented by one selected from the group consisting of Formulae 1a through 1n:

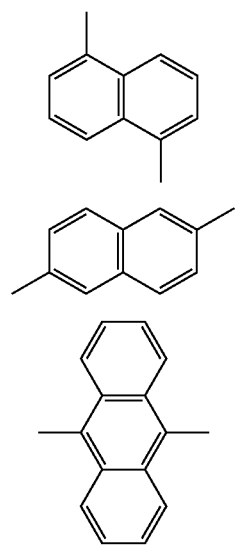
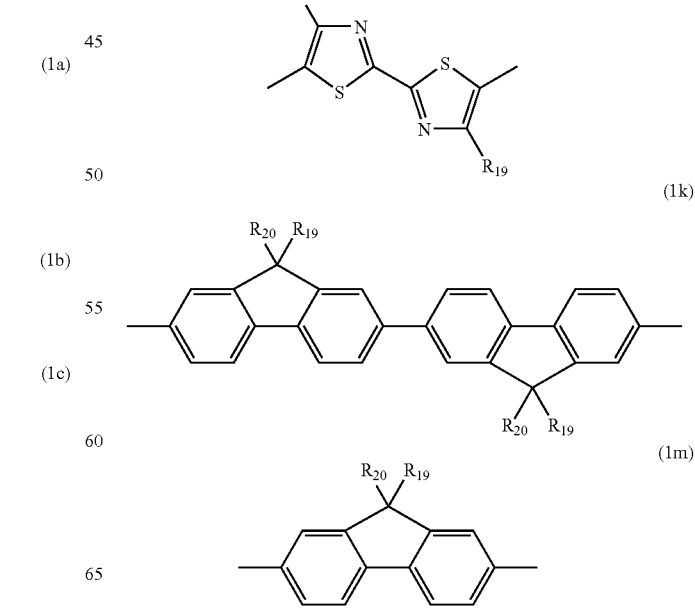

-continued

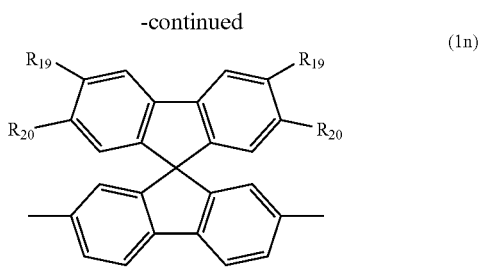

(1n)

wherein $R_{19}$ and $R_{20}$ are each independently selected from the group consisting of hydrogen, a substituted or unsubstituted alkyl group of C1-C12, a substituted or unsubstituted alkoxy group of C1-C12, and a substituted or unsubstituted amino group.

11. The organic electroluminescent device of claim 9, wherein the polymer is represented by Formula 2:

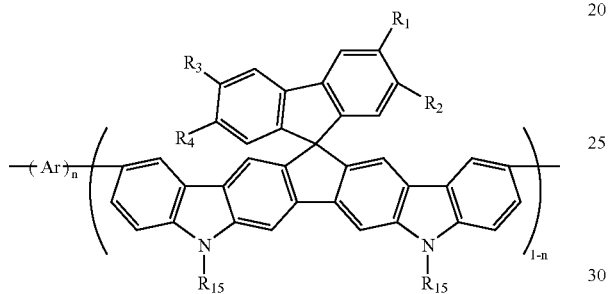

(2)

wherein each $R_{15}$ is independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30.

12. The organic electroluminescent device of claim 9, wherein the polymer has a weight average molecular weight (Mw) of 10,000 to 2,000,000, and a molecular weight distribution (MWD) of 1 to 5.

13. The organic electroluminescent device of claim 9, wherein the organic layer is a hole transport layer.

14. The organic electroluminescent device of claim 9, wherein the organic layer is a light-emitting layer.

15. The organic electroluminescent device of claim 14, wherein the light-emitting layer comprises a host of the polymer and a dopant, and the content of the dopant is in the range from 30 to 80 parts by weight based on the total weight of the host and the dopant.

16. The organic electroluminescent device of claim 14, wherein the light-emitting layer is formed of a composition including 0.01 to 10 percent by weight of the polymer and a solvent.

17. An organic electroluminescent device, comprising:
a first electrode;
a second electrode;
a light-emitting layer between the first electrode and the second electrode; and
optionally a hole transport layer between the light-emitting layer and the first electrode, one of the light-emitting layer and the hole transport layer formed from a polymer represented by Formula (1):

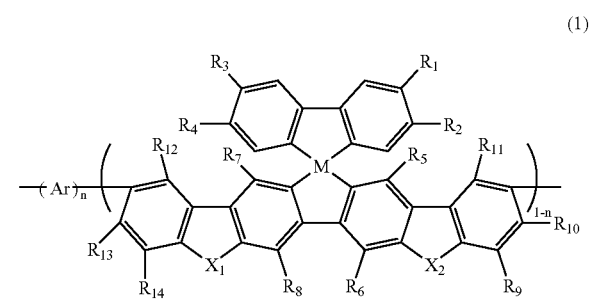

(1)

wherein Ar is selected from the group consisting of a substituted or unsubstituted arylene group of C6-C30 and a substituted or unsubstituted heteroarylene group of C2-C30;

$R_1$ through $R_{14}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

$X_1$ and $X_2$ are each independently S, $NR_{15}$, $Si(R_{16}R_{17})$, or $PR_{18}$ where $R_{15}$, $R_{16}$, $R_{17}$, $R_{18}$ are each independently selected from the group consisting of hydrogen, a substituted or unsubstituted alkyl group of C1-C30, a substituted or unsubstituted cycloalkyl group of C3-C30, a substituted or unsubstituted aryl group of C6-C30, a substituted or unsubstituted arylalkyl group of C6-C30, a substituted or unsubstituted trialkylsilyl group of C3-C30, a substituted or unsubstituted alkoxy group of C1-C30, a substituted or unsubstituted aryloxy group of C6-C30, a substituted or unsubstituted heteroaryl group of C5-C30, a substituted or unsubstituted heteroarylalkyl group of C5-C30, a substituted or unsubstituted heteroaryloxy group of C5-C30, and a substituted or unsubstituted heterocycloalkyl group of C5-C30;

M is C, Ge, Si, or Sn; and
n is a real number from 0 to 0.99.

18. The organic electroluminescent device of 17, wherein the polymer has a weight average molecular weight of 10,000 to 2,000,000, and a molecular weight distribution of 1 to 5.

19. The organic electroluminescent device of claim 17, wherein the layer formed from the polymer represented by Formula(1) is the light-emitting layer.

* * * * *